United States Patent
Huynh et al.

(10) Patent No.: US 9,514,831 B2
(45) Date of Patent: Dec. 6, 2016

(54) MULTI-CLOCK GENERATION THROUGH PHASE LOCKED LOOP (PLL) REFERENCE

(71) Applicant: SanDisk Technologies Inc., Plano, TX (US)

(72) Inventors: Jonathan Huynh, San Jose, CA (US); Sung-En Wang, San Jose, CA (US); Steve Choi, Danville, CA (US); Jongmin Park, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/596,779

(22) Filed: Jan. 14, 2015

(65) Prior Publication Data

US 2015/0214964 A1    Jul. 30, 2015

Related U.S. Application Data

(60) Provisional application No. 61/932,971, filed on Jan. 29, 2014.

(51) Int. Cl.
| | |
|---|---|
| *G11C 16/04* | (2006.01) |
| *G11C 16/30* | (2006.01) |
| *G11C 5/14* | (2006.01) |
| *H03L 7/089* | (2006.01) |

(52) U.S. Cl.
CPC ............... *G11C 16/30* (2013.01); *G11C 5/145* (2013.01); *H03L 7/0891* (2013.01)

(58) Field of Classification Search
CPC ............ H03L 7/099; H03L 7/081; H03L 7/00; H03L 7/07; H03L 7/08; H03L 7/087; H03L 7/0991; H03L 7/0995; H03L 7/06; H03L 7/0807; H03L 7/18; H03L 7/183; H03L 7/197; G11C 5/147; G11C 7/1072

See application file for complete search history.

(56) References Cited

U.S. PATENT DOCUMENTS

| | | | |
|---|---|---|---|
| 5,426,398 | A | 6/1995 | Kuo |
| 5,570,315 | A | 10/1996 | Tanaka et al. |
| 5,903,495 | A | 5/1999 | Takeuchi et al. |
| 5,955,929 | A | 9/1999 | Moon et al. |
| 5,963,105 | A | 10/1999 | Nguyen et al. |
| 6,046,935 | A | 4/2000 | Takeuchi et al. |
| 6,211,743 | B1 | 4/2001 | Rhee et al. |

(Continued)

FOREIGN PATENT DOCUMENTS

| | | |
|---|---|---|
| CN | 102664605 A | 9/2012 |
| GB | 2460538 A | 12/2009 |
| WO | 0076069 A2 | 12/2000 |

*Primary Examiner* — Son Dinh
*Assistant Examiner* — Uyen B Tran
(74) *Attorney, Agent, or Firm* — Davis Wright Tremaine LLP

(57) ABSTRACT

A circuit for providing a plurality of clock signals of differing frequencies includes: a phase locked loop section including a first voltage controller oscillator, connected to receive a reference clock value and generate therefrom a first voltage level, wherein the first voltage controller oscillator receives the first voltage level and generates therefrom a first clock signal; and one or more second voltage controller oscillators, each connected to receive the first voltage level, a corresponding trim value and a corresponding control voltage and derive therefrom a corresponding second clock signal.

18 Claims, 14 Drawing Sheets

(56) References Cited

U.S. PATENT DOCUMENTS

| | | |
|---|---|---|
| 6,686,788 B2 | 2/2004 | Kim et al. |
| 7,106,109 B2 | 9/2006 | Wu |
| 7,554,311 B2 | 6/2009 | Pan |
| 8,085,099 B2 | 12/2011 | Pancholi et al. |
| 8,339,183 B2 | 12/2012 | Htoo et al. |
| 8,669,836 B2 | 3/2014 | Kulke et al. |
| 8,710,907 B2 | 4/2014 | Nguyen et al. |
| 8,836,412 B2 | 9/2014 | Wang et al. |
| 2002/0114418 A1* | 8/2002 | Nakamura .............. H03L 7/087 375/376 |
| 2008/0158969 A1 | 7/2008 | Moogat et al. |
| 2010/0090768 A1* | 4/2010 | Yamazaki ............. H03L 7/0995 331/15 |
| 2011/0215846 A1* | 9/2011 | Furuta ....................... H03L 7/08 327/148 |
| 2011/0267146 A1* | 11/2011 | Finocchiaro .............. H03L 7/10 331/2 |
| 2012/0147649 A1 | 6/2012 | Samachisa et al. |
| 2012/0331207 A1* | 12/2012 | Lassa ................... G06F 1/3278 711/103 |
| 2014/0179068 A1 | 6/2014 | Samachisa et al. |
| 2014/0192595 A1 | 7/2014 | Samachisa |

\* cited by examiner

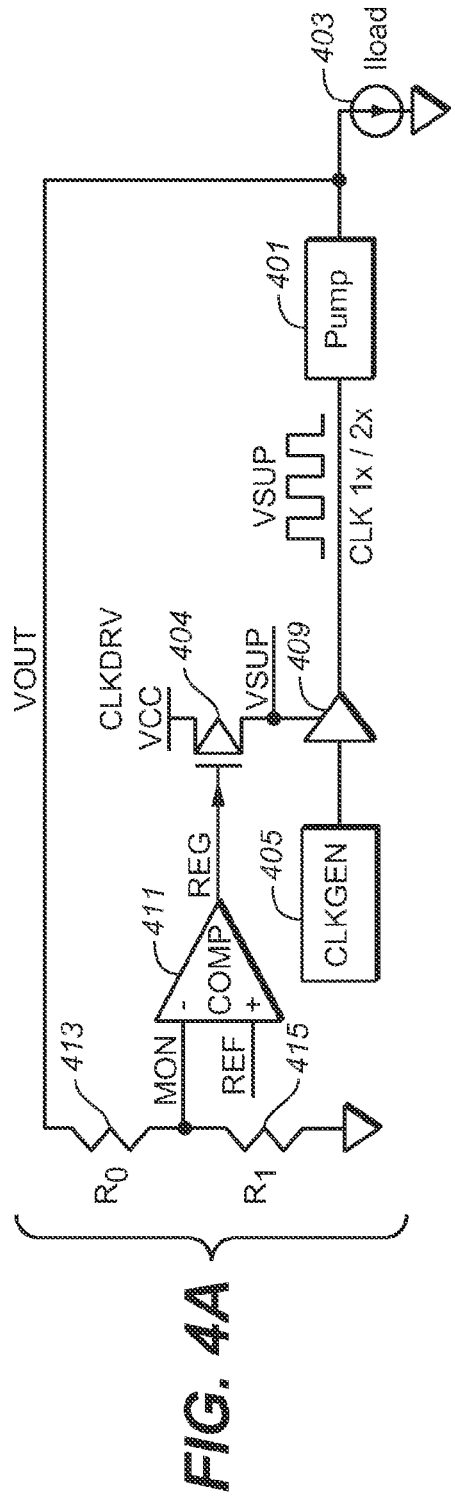
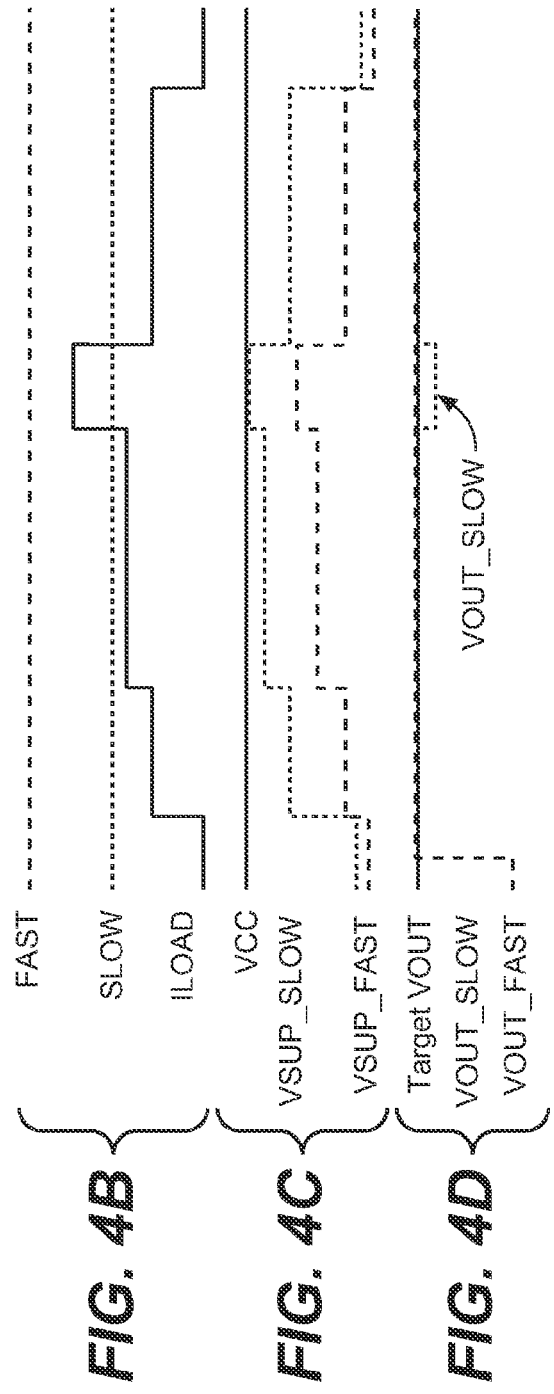
FIG. 4A
FIG. 4B
FIG. 4C
FIG. 4D

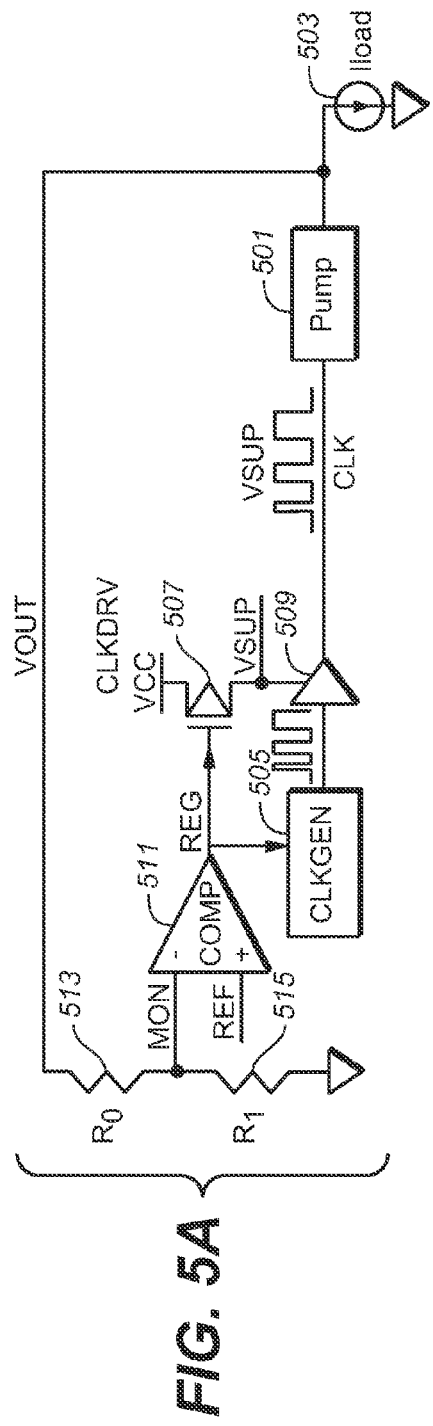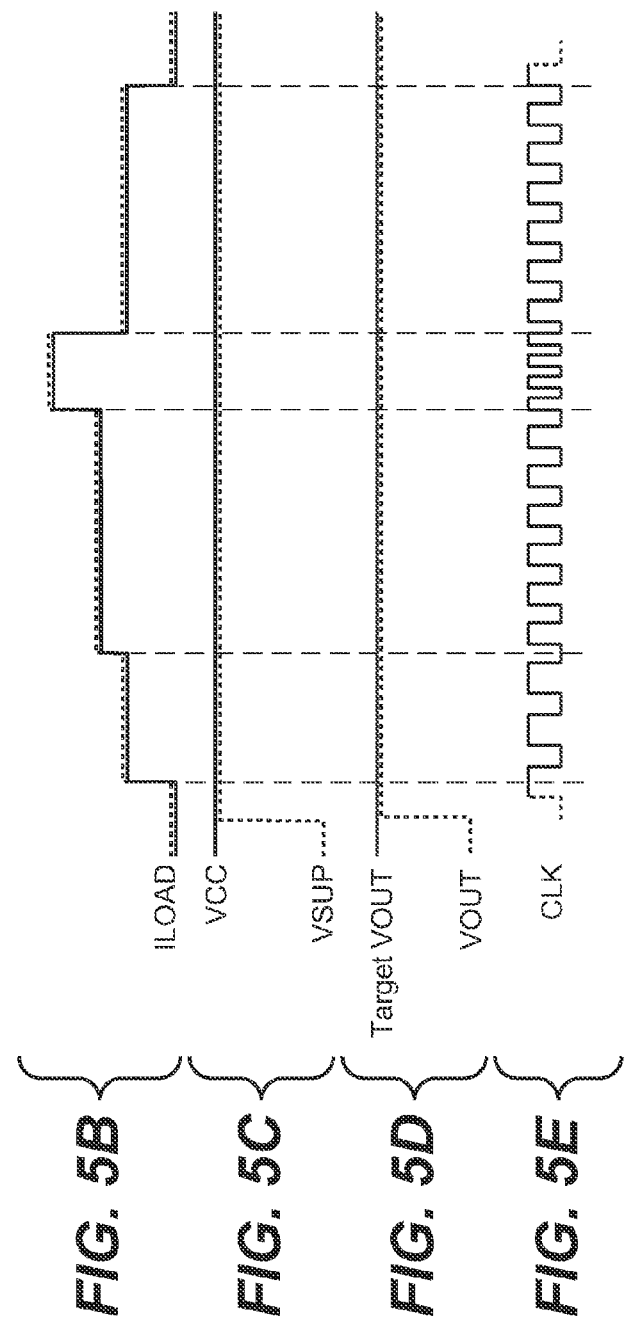

MULTI-CLOCK GENERATION THROUGH PHASE LOCKED LOOP (PLL) REFERENCE

CROSS-REFERENCE TO RELATED APPLICATIONS

This application claims priority from U.S. Provisional Application No. 61/932,971, filed on Jan. 29, 2014, which is hereby incorporated herein by this reference in its entirety for all purposes.

FIELD OF THE INVENTION

The following pertains generally to the field of charge pumps and more particularly to techniques for regulating charge pumps.

BACKGROUND

Charge pumps use a switching process to provide a DC output voltage larger or lower than its DC input voltage. In general, a charge pump will have a capacitor coupled to switches between an input and an output. During one clock half cycle, the charging half cycle, the capacitor couples in parallel to the input so as to charge up to the input voltage. During a second clock cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

Charge pumps are used in many contexts. For example, they are used as peripheral circuits on flash and other non-volatile memories to generate many of the needed operating voltages, such as programming or erase voltages, from a lower power supply voltage. A number of charge pump designs, such as conventional Dickson-type pumps, are known in the art. But given the common reliance upon charge pumps, there is an ongoing need for improvements in pump design, particularly with respect to trying to save on current consumption.

SUMMARY

A circuit for providing a plurality of clock signals of differing frequencies includes a phase locked loop section connected to receive a reference clock value and provide a first clock signal, including a first voltage controlled oscillator connected to receive a receive a first voltage level and generate from it the first clock signal. The first voltage level is generated by the phase locked loop section based upon the reference clock value and feedback from the first clock signal. The circuit also includes one or more second voltage controller oscillators, each connected to receive the first voltage level and a corresponding trim value and generate from these a respective second clock signal having a frequency dependent upon the first voltage level and corresponding trim value.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features may be better understood by examining the following figures, in which:

FIGS. 4A-D look at the regulation of a charge pump using a fixed pump clock value;

FIGS. 5A-E look at the regulation of a charge pump using a pump clock value that can be varied continuously by the regulation circuitry based on feedback from the pump's output.

DETAILED DESCRIPTION

Charge pumps are often operating in a low efficient region. To maintain small ripple, amplitude control can be used to match charge pump's drivability to its load; and to handle the worst case loading condition, charge pumps are often operating in a low efficient region where pump's full strength drivability and its load are greatly mismatched. DC-DC converters such as charge pumps are typically optimized for power efficiency for the supplying large load currents. For example, on a non-volatile memory system this requirement is mainly related to AC capacitive current to needed charge up word lines. The efficiency of the system may drop to extremely low levels, less than 1% in some applications, after the capacitive load is charged up and the load current reduces to just what is needed due to leakage, as is the case during regulation to maintain word line voltages. Although performance requirements are based on the charging-up period, the system will typically be operating under regulation for a greater amount of time. To improve overall power efficiency, the power efficiency during regulation needs to be improved since it accounts for a significant amount of total operation time.

Figure 1A:
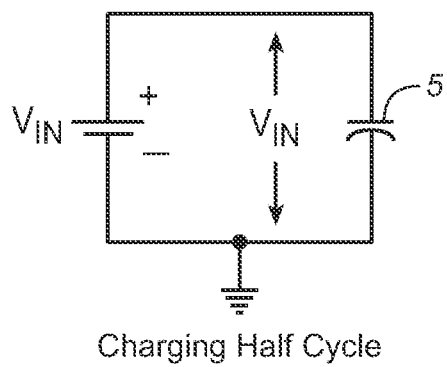
FIG. 1a is a simplified circuit diagram of the charging half cycle in a generic charge pump.
Figure 1B:
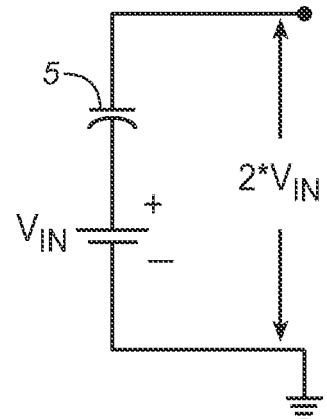
FIG. 1b is a simplified circuit diagram of the transfer half cycle in a generic charge pump.
Figure 2:
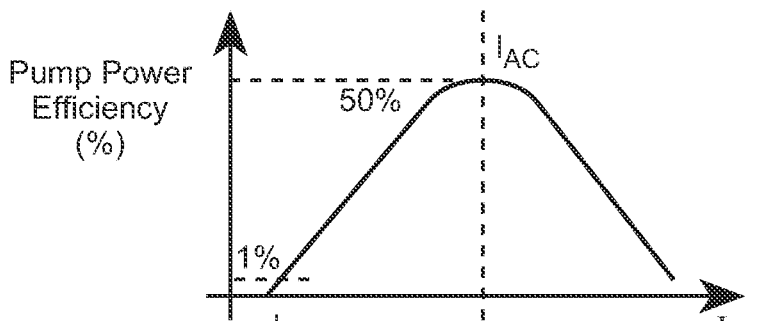
FIG. 2 illustrates the power efficiency of a charge pump system for various load levels.

FIG. 2 illustrates the efficiency of a charge pump system for various load levels. As shown, the DC-DC converter is optimized for power efficiency for the certain large load current levels, $I_{AC}$, mainly related to the main task for the pump, such as AC capacitive current to charge up word lines in a memory circuit example. Once this capacitance is charge up, the load current will reduce down to the leakage current, $I_{leakage}$, and the efficiency drops significantly, to possibly even below 1%. In the memory circuit example, $I_{leakage}$, is the level needed during regulation to maintain the word line voltage. To improve overall power efficiency for the system, power efficiency during regulation can be improved, since it accounts for a significant amount of total operation time.

The following presents techniques for maintaining a pump's output at a target value and pump strength, while power can be saved by dynamically adjust the clock frequency with full potential clock swing to match pump's driving strength to its DC load. A common application for charge pumps is in non-volatile memory circuits, such as those of the NAND flash or 3D type, that are often integrated into digital mobile devices where power consumption is one of the key features for performance. Outside of the actual memory array, charge pumps that generate supply voltage for peripheral circuits are significant power consumption blocks on the memory circuit. The pump systems presented below can help to maintain the output at a target value and pump strength while power is saved by dynamically adjusting the clock frequency with full potential clock swing to match pump's driving strength to the load.

The following is primarily concerned with the regulation circuitry of charge pump systems rather than the details of the pump itself. For example, the pump can be based on a Dickson-type pump, voltage doublers, four-phase, and so on. More detail on various pumps and pump system within which the following concepts can be applied can be found in U.S. patent application Ser. No. 14/101,180 and references cited therein.

Figure 3:
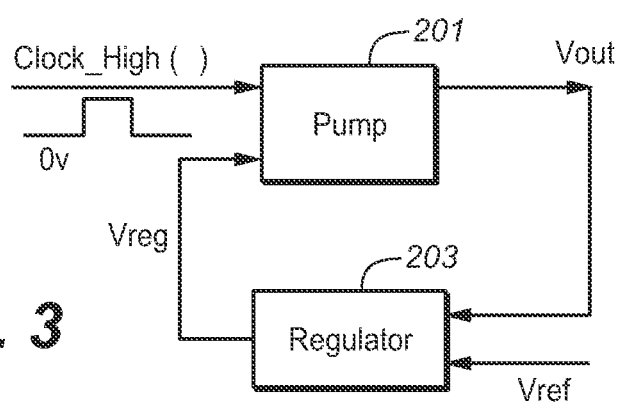
FIG. 3 is a top-level block diagram for a regulated charge pump.

With respect to regulation, FIG. 3 is a simplified top-level block diagram of a typical charge pump using an output voltage based regulation scheme. As shown in FIG. 3, the pump 201 has as inputs a clock signal and a voltage Vreg and provides an output Vout. The clock generation circuit is not explicitly shown in FIG. 3, although it may be considered part of the charge pump system in some embodiments or taken as an external input. The high (Vdd) and low (ground) connections are also not explicitly shown. The voltage Vreg is provided by the regulator 203, which has as inputs a reference voltage Vref from an external voltage source and the output voltage Vout. The regulator block 203 generates feedback control signal Vreg such that the desired value of Vout can be obtained. The pump section 201 may have any of various designs for charge pumps, such as described in the various references cited above including charge doubler-type circuits with cross-coupled elements as well as the Dickson-type pumps described below for the exemplary embodiments. (A charge pump is typically taken to refer to both the pump portion 201 and the regulator 203, when a regulator is included, although in some usages "charge pump" refers to just the pump section 201. In the following, the terminology "charge pump system" will often be used to describe pump itself as well as any regulation or other peripheral elements.) The regulator block 203 typically compares the Vref to the Vout value by using a voltage divider circuit. The voltage divider can be a resistive divider, a capacitive divider, or some combination (see, for example, U.S. Pat. No. 7,554,311).

FIGS. 4A-D look at a regulated charge pump system in more detail. The block diagram of FIG. 4A includes pump 401 driving a load represented at 403. The pump is driven by a clock signal CLK from a clock generator circuit CLKGEN 405 that is supplied through a clock driver. The clock driver CLKDRV includes the buffer 407 that is supplied at a level VSUP from the VCC level by the transistor 409. The pump 401 then receives the clock signal of amplitude VSUP. In this example the clock can be supplied with a fast (1×) and a slow (2×) period. The gate of the driver's transistor 409 is controlled by the regulation circuitry, with the output REG of the comparator 411 connected to the control gate of transistor 409. The inputs of the comparator 411 are connected to receive a reference level REF and feedback from the pump's output VOUT taken from a node of, in this example, a resistive voltage divider formed from $R_0$ 413 and $R_1$ 415.

The operation of the circuit of FIG. 4A is described with respect to FIGS. 4B-D. In FIG. 4B, ILOAD is an example of a DC load current profile; FAST is the current for the pump operating at maximum driving strength; and SLOW is the current for the pump at maximum driving strength, but at a 2 times slower clock frequency from FAST. In the arrangement of FIG. 4A, the lock frequency is usually predetermined by considering worst case loading; however, it practice it is difficult to determine the exact timing and loading for the circuit due the many different factors that enter in to load variation.

In FIG. 4C, VCC is the external supply level; VSUP_FAST is the pump clock's supply level under regulation; and VSUP_SLOW is the pump clock's supply in regulation at a twice (2×) slower clock frequency relative to FAST. Matching pump's driving strength with the load is realized by a voltage drop to the clock supply, limiting the pump's strength. This results in large inefficiencies and power loss due to voltage drop, as illustrated by the gap between VCC and the VSUP levels.

FIG. 4D illustrates the target pump output VOUT along with the realistic pump outputs VOUT_FAST and VOUT_SLOW, where the SLOW value is the pump output at a 2× slower clock frequency relative to FAST. In FIG. 4D, both of VOUT_FAST and VOUT_SLOW rise to the target level and, mostly, stay there, except that at the highest load current VOUT_SLOW drops. This reflects that by not selecting the proper clock frequency (that is, in this example by selecting SLOW instead of FAST), VOUT can be out of the specification due to the pump's strength being too weak. If it is instead selected to the have proper clock frequency (here, FAST), the pump's ability and target load are can be greatly mismatched except for this peak current situation, resulting in a big Icc penalty.

FIGS. 5A-E illustrate an exemplary embodiment of a charge pump system to help reduce this sort of inefficiency. FIG. 5A is a schematic representation of a charge pump system, where similar elements are numbered similarly to those of FIG. 4A (501 versus 401 for the charge pump, and so on). In FIG. 5A, the regulation elements are now used to control the clock frequency, as illustrated the output REG of the comparator COMP 511 now being supplied to the clock generator block CLKGEN 505. This results in the clock period varying with the regulation level, as illustrated schematically in the output of CLKGEN 505 and also the clock driver 509 of the clock driver. (In this embodiment REG is also used to control the VSUP level provided the buffer 509 as in FIG. 4A, but this is optional in the embodiment of FIG. 5A.)

In FIG. 5B ILOAD is again the DC Load current profile, which is the same example as in FIG. 4b, and the line of larger squares is the pump maximum driving strength for the arrangement of FIG. 5A. This closely matches with the load, being a little stronger. At bottom, in FIG. 5E is the clock pump value CLK, showing how this varies with the requirements of the load.

FIG. 5C illustrate the relation of the external supply level VCC and the pump clock supply level VSUP under regulation. There is a relatively minimal voltage drop from VCC to VSUP. This matching of the pump's driving strength to the DC load with minimal voltage drop can allow for significant improvements in efficiency and power savings.

In FIG. 5D, the target VOUT level is compared to the level provided by the system of FIG. 5A. By maintain the pump's output at the target value and dynamically adjusting the clock frequency with full potential clock swing, the system can match pump's driving strength to the DC load.

Figure 6A:
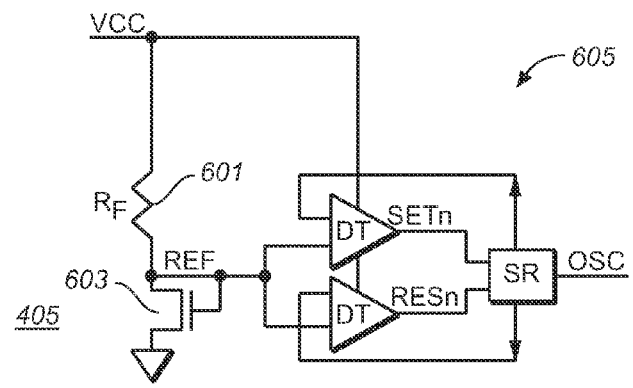
FIGS. 6A and 6B respectively look at the clock generation blocks of FIGS. 4A and 5A in more detail.
Figure 6B:
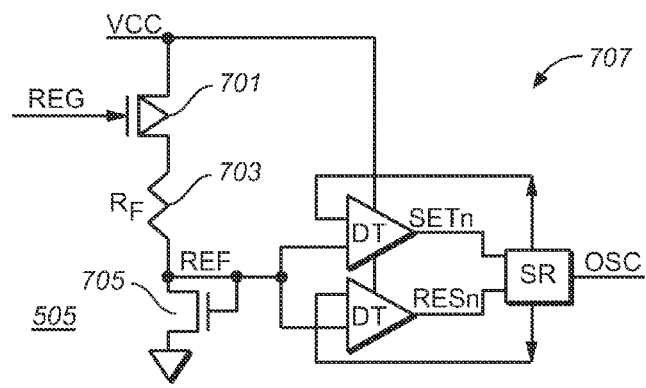

FIGS. 6A and 6B look at an exemplary embodiment of how the clock frequency can be dynamically adjusted based on the VOUT level for the regulation. FIG. 6A is an example for a CLKGEN block 405 as in FIG. 4A. At right is an oscillator circuit 605 whose output frequency OSC depends on an input voltage level REF. Here REF is used as input to the detectors DT that provide the set/reset signals to the flip-flop SR, which in turn outputs OSC as well as the second inputs to the detectors. In this example, the oscillator is a relaxation RC oscillator, but ring oscillators or other circuits could be used. To provide the input voltage, a fixed resistance $R_F$ 601 is connected in series with a diode connected transistor 603 between and ground. The input voltage REF is taken from the node between resistance $R_F$ 601 and diode 603. As REF is fixed, the generated clock frequency OSC is fixed.

Figure 6C:
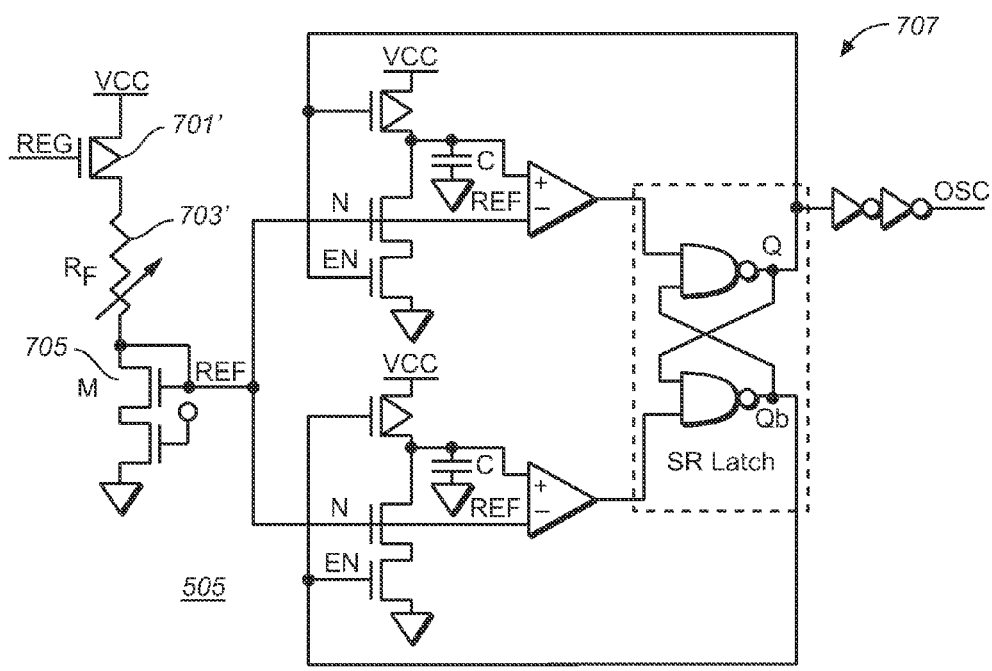
FIG. 6C is a more detailed version of FIG. 6B.

FIG. 6B gives an example of a CLKGEN block 505 such as could be used in FIG. 5A. Instead of a fixed REF value, REF is adjusted by the regulation circuitry to generate a clock frequency to match the pump's ability to drive the DC load it sees. The oscillator 707 is again taken as a relaxation RC oscillator, but ring oscillators or other circuits could be used. The divider circuit used to provide REF now uses the regulation signal REG based on feedback from VOUT to determine the REF level and, hence, the OSC frequency. The node from REF is taken in again connected to ground (or, more generally, the low voltage level) through the diode connected transistor 705. In other embodiments, a resistor could be used. Between VCC and the REF, a variable resistance whose value depends on REG is now included. Here this is implemented by the PMOS 701 whose gate is connected to receive the regulation signal. In this embodiment, a fixed resistance $R_F$ 703 is in series with the variable element. For references, FIG. 6C is a more detailed version of FIG. 6B that includes the capacitances and other elements in more detail. (In FIG. 6C, the resistance $R_F$ 703' is illustrated as variable, indicating that it, or at least a portion of it, is adjustable in order to set the RC constant of the circuit; however, as far as the REG value, this is still a fixed value and does not vary with the regulation level.) Other embodiments could arrange the elements of divider supplying REF differently and use other element, such as an NMOS instead of the PMOS, for example. In this way, the clock frequency CLK for the pump can track the requirements of the load as described in FIGS. 5B-D.

For any of the variations, the arrangement described above can increase power savings and reduce current consumption of the charge pump block. By adjusting the pump clock frequency to regulate pump operations, the pump's maximum driving strength with full clock swing is matched to the pump's DC load for higher efficiency.

Multi-Clock Generation Through PLL Reference

In flash memory, power consumption is a key element for performance. To reduce power consumption, more efficient charge pumps and usage are required. As a result, charge pumps require their own clock frequency so that their output capability can match their load. With many different supplies (charge pumps), many clock generators are required.

The techniques presented here for clock generation can be implemented as peripheral elements on integrated circuits for many applications. In particular, such clock circuits are often part of a non-volatile memory circuit, such as flash NAND memory and non-volatile memories having a 3D array type structure. More detail on NAND memory devices can be found in US patent and publication US No. 20080158969; U.S. Pat. Nos. 5,570,315; 5,903,495; and 6,046,935, for example. More detail on non-volatile memory having a 3D array structure can be found in US patent publication numbers: 2012-0147649; 2014-0192595; and 2014-0179068, for example.

With respect to the memory devices, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but cover all relevant memory structures within the spirit and scope as described herein One way to provide a number of separate clock signals, whether on memory devices or other circuits, is where each clock is generated by a separate trimmable RC-oscillator, which requires more area and Icc. In this section, techniques are instead presented for generating a reference clock through phase lock loop (PLL) at a certain frequency, and then using a voltage control (VCTRL) as a reference to set as the maximum or minimum of other derived frequencies. It can also be used, with other controls or inputs, to generate many different clock frequencies that can be trimmed to be a fixed value or adjustable on the fly. Since the VCO can be formed by use of a few inverters (ring oscillator), Icc and area can be reduced relative to having multiple separately trimmable RC-oscillators.

Figure 7:
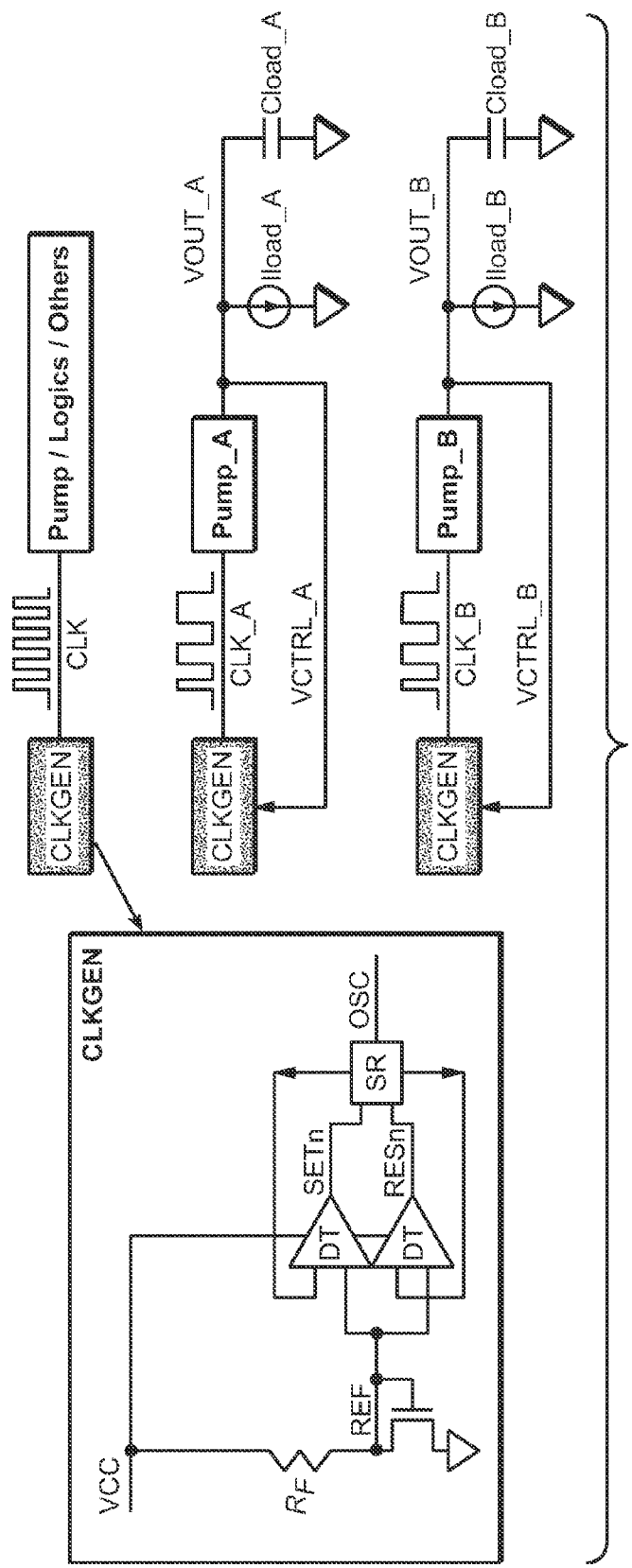
FIG. 7 looks an example similar to that described above with respect to FIG. 6A for generating clock signals.

FIG. 7 looks an example similar to that described above with respect to FIGS. 6A-C far generating clock signals in a NAND flash system or 3D type non-volatile memory system. There will typically be many clock generators due to dedicated clocks for charge pumps to obtain high efficiency (reduced Icc) across different loading conditions, for other pumps, logics, and so on. FIG. 7 illustrates this for an example where one clock (CLK) is needed for various logic, pump and other circuits, and two individually regulated pumps (A, B) receive corresponding clock signals drive two different loads. Each of these clock generation circuits would be distinct, such as shown at the left of the figure or in more details in FIGS. 6A-C. The multiple clock generation circuits results in a larger area and higher current consumption (Icc).

To reduce area requirements, current consumption, or both, this section presents techniques for generating a reference clock through phase lock loop (PLL) at a certain frequency, and then using one or more voltage controls (VCTRL) as a reference to set the maximum or minimum of other derived frequencies. This can be used, with other controls or inputs, to generate many different clock frequencies by use of voltage controlled oscillators (VCOs): trimmed to be fixed or adjustable on the fly, such as for the regulation of charge pumps, for example. Since a VCO can be formed of a few inverters (ring oscillator), Icc and area can be reduced. Note that although the focus of PLLs is traditionally for accuracy (low noise) and high speed, here the focus is more on reducing layout area and Icc, with the frequencies involved being relatively lower than common PLL applications.

Figure 8A:
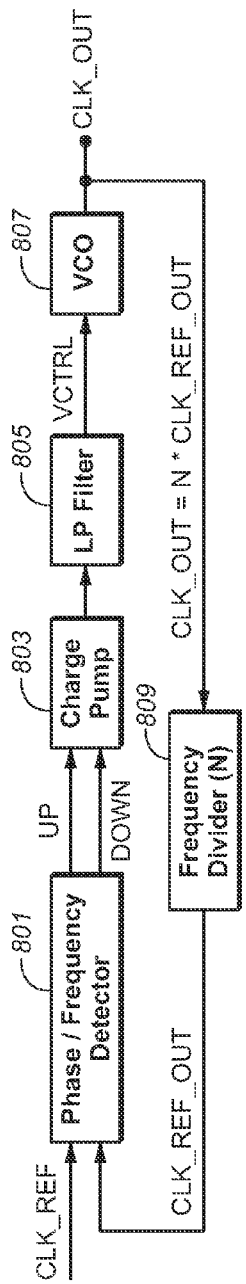
FIGS. 8A and 8B look at a Phase Lock Loop (PLL) and some of the basic parts in the exemplary embodiment here.
Figure 8B:
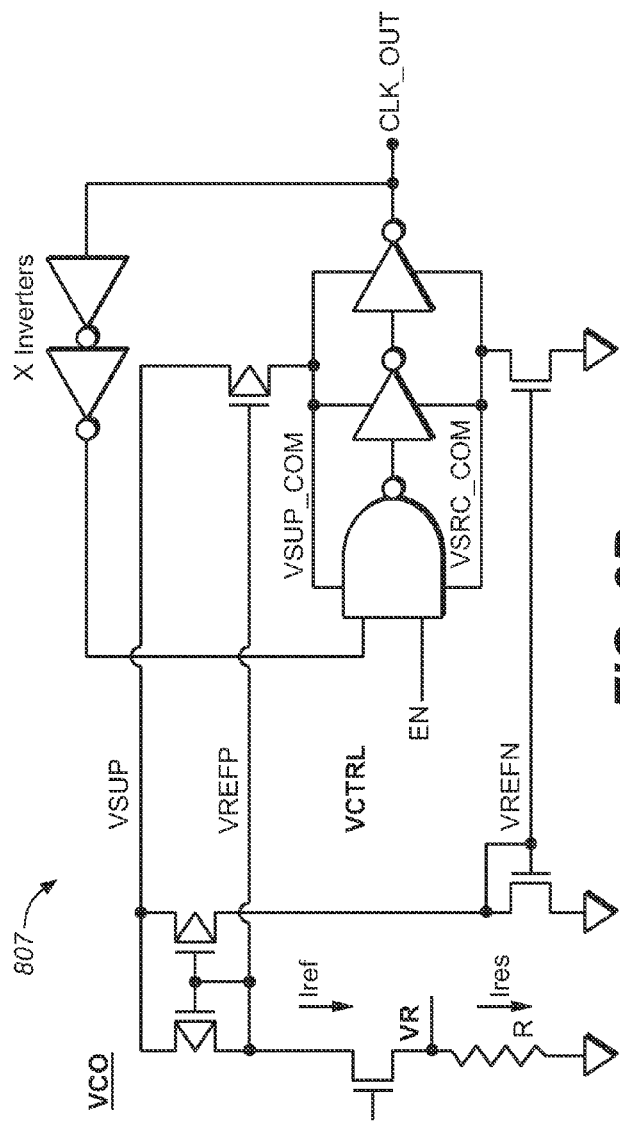

FIGS. 8A and 8B look at a Phase Lock Loop (PLL) and some of the basic parts in the exemplary embodiment here. An input reference clock is received at a phase/frequency detector (PFD) 801 along with a clock (CLK_REF_OUT) derived from the output clock (CLK_OUT). Based these two values, PFD 801 generates UP and DOWN that are supplied to a charge pump 803, whose output passes through a low pass filter 805 to provide the control voltage VCTRL to regulate the oscillator 807 to generate the output clock CLK_OUT. (The shown charge pump in the PLL, between the FPD and the low pass filter is here used to function more as a switch than a high voltage charge pump.) FIG. 8B is an exemplary embodiment for a VCO, illustrating how VCTRL is used to control the current Iref that is mirrored to control CLK_OUT. CLK_OUT then is fed back through a frequency divider 809 and back to PFD 801. For example, consider the example of a given CLK_REF=200 ns, frequency divider with N=4, and target at CLK_OUT=50 ns. Once enabled, the PFD 801 will adjust VCTRL such that CLK_OUT will reach target of 50 ns and CLK_REF_OUT will be in phase with CLK_REF at 200 ns. The circuit will eventually lock in the target frequency and VCTRL becomes a stable voltage for CLK_OUT with given CLK_REF. VCTRL maintains the current (Iref) that will mirror to control supply of the ring oscillator, where (see FIG. 8B) Iref=Ires=VR/R.

Figure 9A:
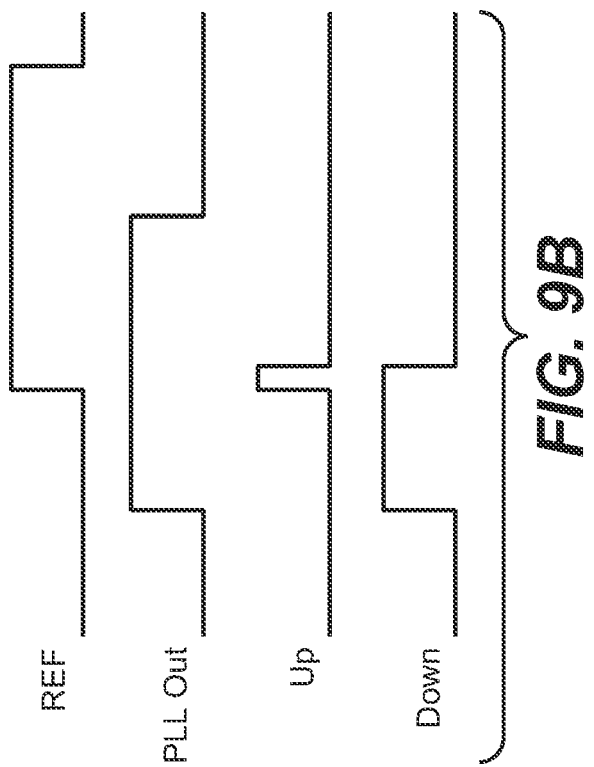
FIGS. 9A and 9B look at the Phase/Frequency Detector (PFD) functionality.
Figure 9B:
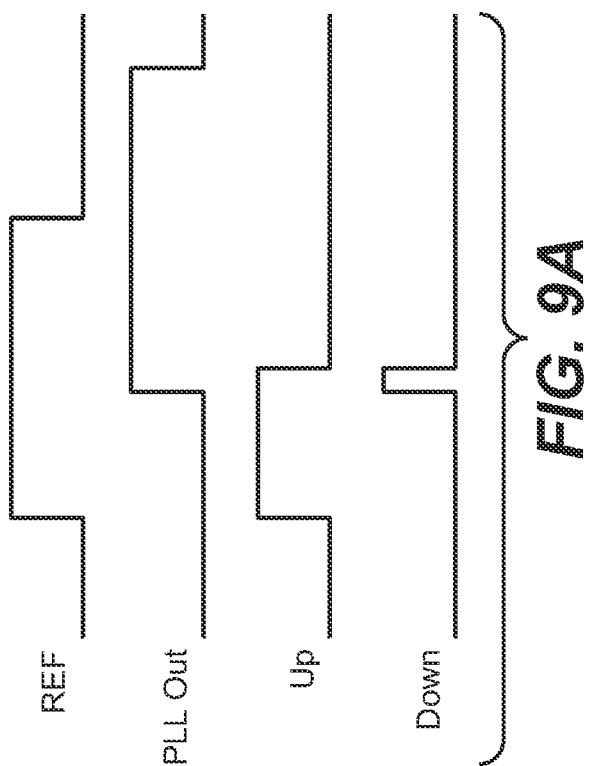

FIGS. 9A and 9B look at the Phase/Frequency Detector (PFD) functionality. This will detect the edge of Reference clock (CLK_REF in FIG. 8A) and PLL output (CLK_REF_OUT in FIG. 8A): if REF is faster, the pump charges into VCTRL to increase the PLL output frequency; and if REF is slower, the pump discharges charge from VCTRL to decrease PLL output frequency. As shown in FIG. 9A, REF is faster, so that the UP signal is high until the PLL Out edge is detected, and VCTRL is increased to increase the PLL frequency. In FIG. 9B, REF is slower, so the DOWN signal is high until the REF edge is detected, and VCTRL is decreased to decrease the PLL frequency.

Figure 10:
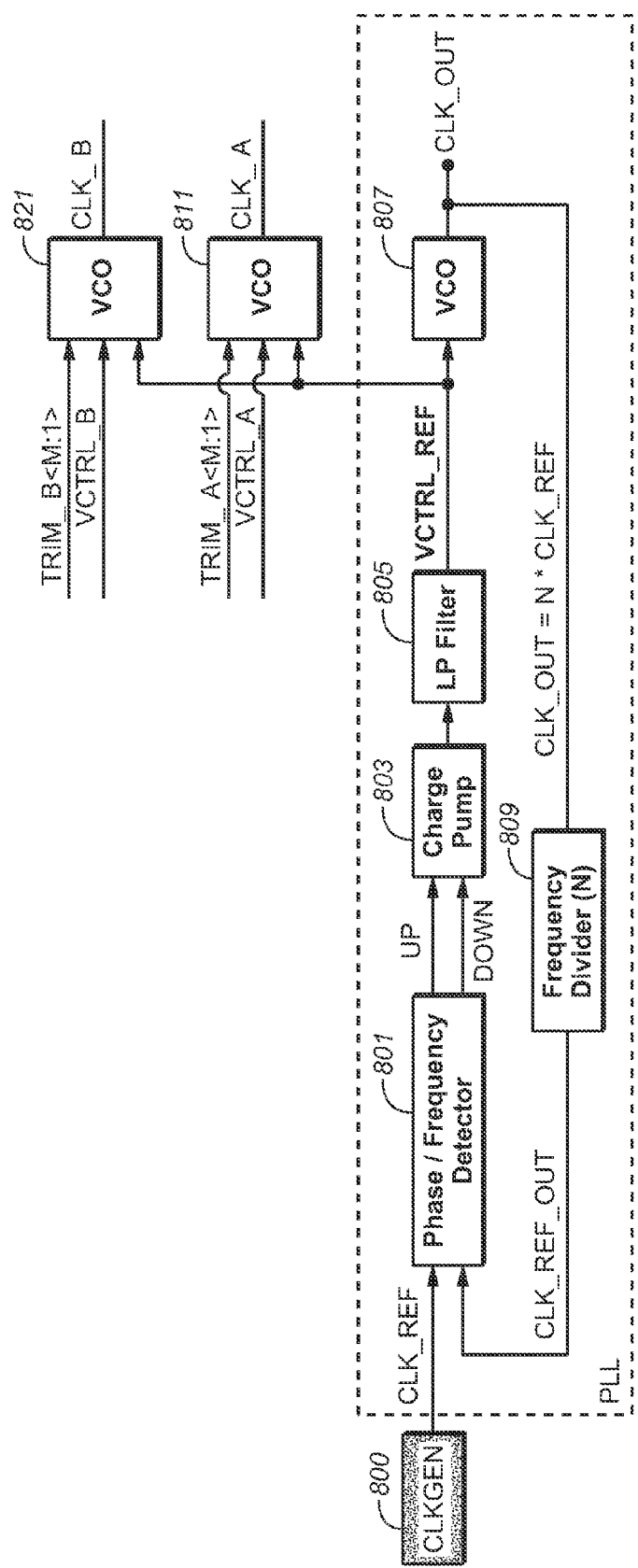
FIG. 10 illustrates an exemplary embodiment for generating two additional clocks.

FIG. 10 illustrates an exemplary embodiment for generating two additional clocks. The elements of FIG. 8A are repeated and similarly number, with a reference clock generator CLKGEN 800 also shown. Additional clock signals can then be generated in addition oscillators, where here two are shown with VCO 811 generating CLK_A and VCO 821 generating CLK_B. The additional clock signals are trimmable and then can also be controlled on the fly, such as based on feedback from a charge pump to be used for regulation purposes. Based on the established VCTRL_REF with known CLK_OUT frequency, the other frequencies can be derived with a couple of parameters. VCTRL_REF now can be used as the reference point. A separate control (for example TRIM_A<M:1>) can be used to adjust or fine tune the derived frequency. A separate VCTRL (for example VCTRL_A which could be feedback from a pump) can be used to modulate the frequency on the fly.

By generating a reference clock through the phase locked loop (PLL) at a certain frequency, the voltage control (VCTRL) is known and be used as a reference to set as the maximum or minimum of other derived frequencies. It can also be used, with other controls or inputs, to generate many other needed different clock frequencies in additional VCO circuits, that can trimmed to be a fixed value or adjustable on the fly. Since a VCO can be made from few inverters (as a ring oscillator), total current (Icc) and area needed for generating these multiple clocks can be reduced. There are many different configurations for either maximum reference or minimum reference VCO embodiments.

Figure 11:
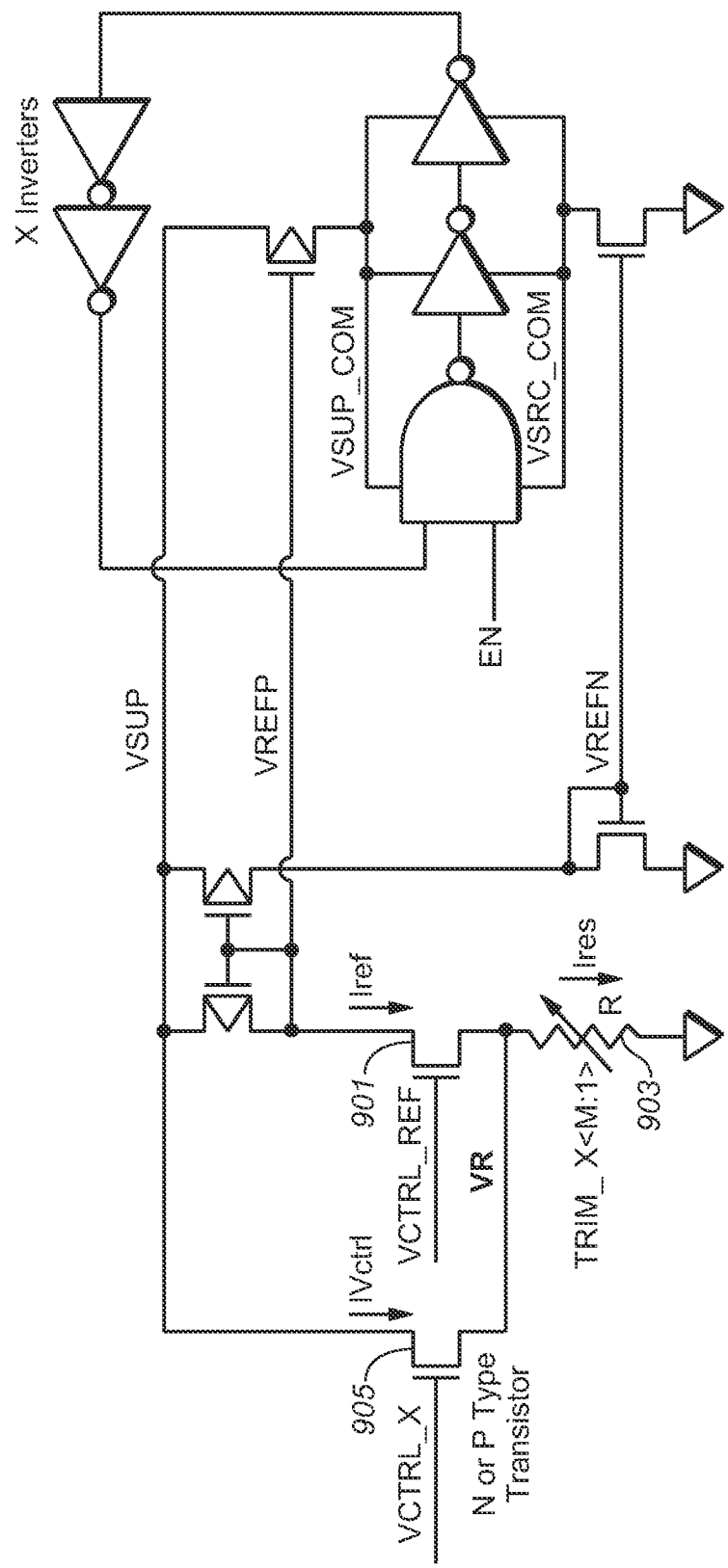
FIG. 11 illustrates one maximum reference VCO embodiment.

FIG. 11 illustrates one embodiment for maximum reference VCO embodiment. Here the basic elements are again arranged as in the exemplary embodiment of FIG. 8B, although other arrangements for the oscillators. Ignoring the far left leg (with transistor 905), the circuit is as in FIG. 8B with the output clock (CLK_X) determined by the VCTRL_REF level from the PLL on the gate of 901. With a given VCTRL_REF, by adjusting the resistor R 903 by TRIM_X<M:1>, Ires and Iref will change. It will affect the VSUP_COM/VSRC_COM and adjust the oscillator frequency. If it is also desired to change the frequency on fly, such as using feedback from regulation circuitry of a charge pump, this can be done by including the left leg with the (P or N type) transistor 905. By adjusting VCTRL_X to the gate of 905, the equation is now changed to Ires=Iref+Ivctrl, affecting the VSUP_COM/VSRC_COM ratio and adjusting the oscillator frequency so that the VCTRL_X can be used to regulate the CLK value downward from a maximum as set by VCTRL_REF and the trim value.

Figure 12A:
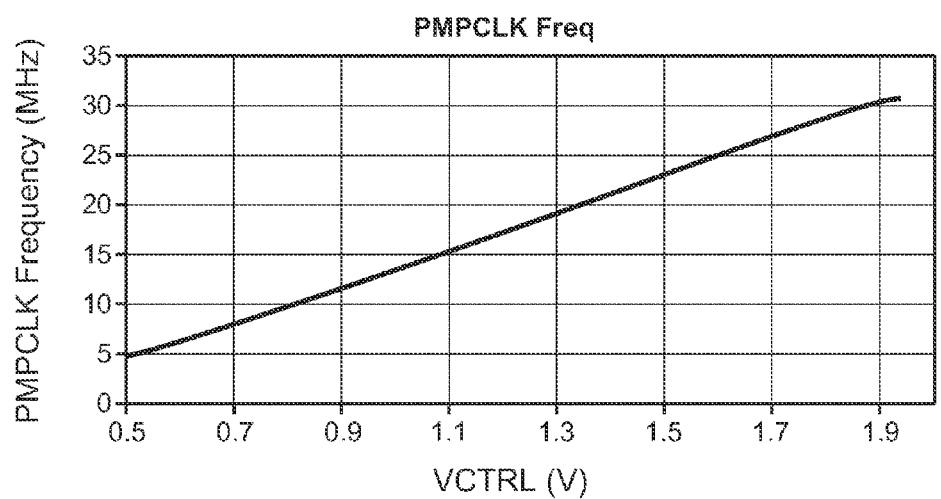
FIG. 12A shows VCTRL_REF sweep for reference PLL CLOCK and FIG. 12B shows that for when VCTRL_REF is set to 50 ns or 20 MHz, changing VCTRL_X will further adjust (slowdown) the output clock frequency.
Figure 12B:
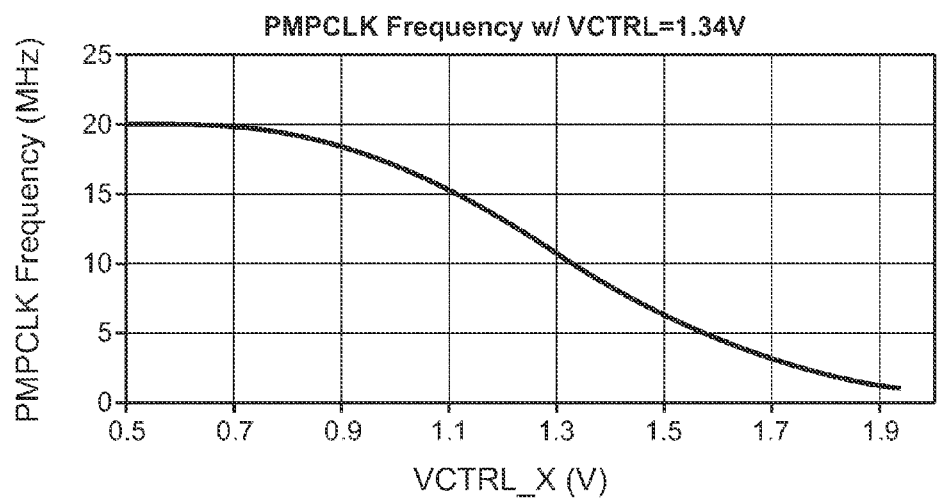

FIGS. 12A and 12B looked at CLK control for this arrangement for a particular example. FIG. 12A shows VCTRL_REF sweep for reference PLL CLOCK and FIG. 12B shows that for when VCTRL_REF is set to 50 ns or 20 MHz, changing VCTRL_X will further adjust (slow down from the maximum) the output clock frequency of the secondary oscillator.

Figure 13:
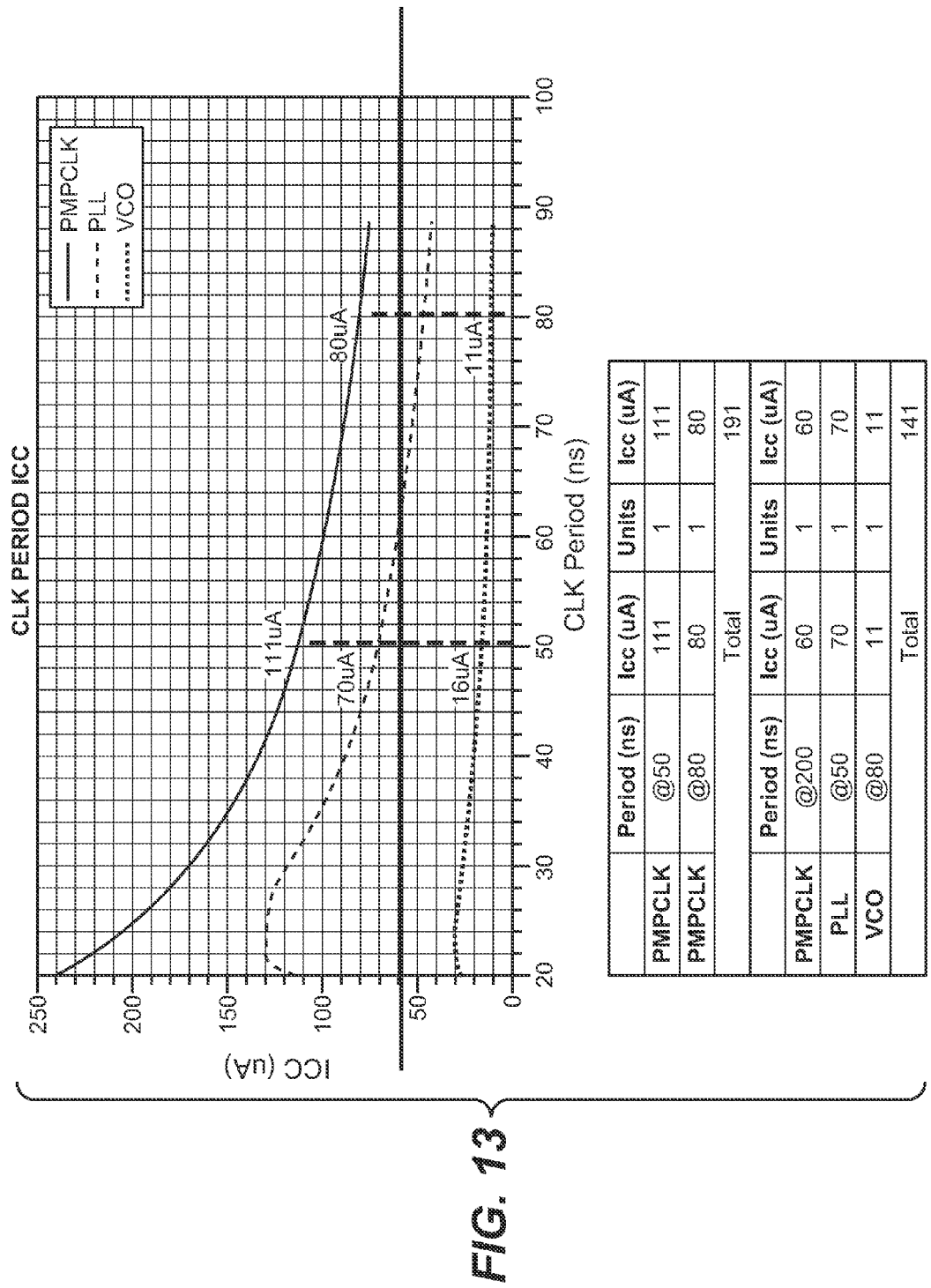
FIG. 13 provides an Icc comparison.

FIG. 13 provides an Icc comparison for a particular implementation. In a system with at least 2 clock frequencies (for example, 50 ns and 80 ns), the embodiments of this section can save at least 25% Icc. As the unit of clock frequency increases, the saving will be realized much further since each additional clock will consume maximum of 16 uA.

Figure 14:
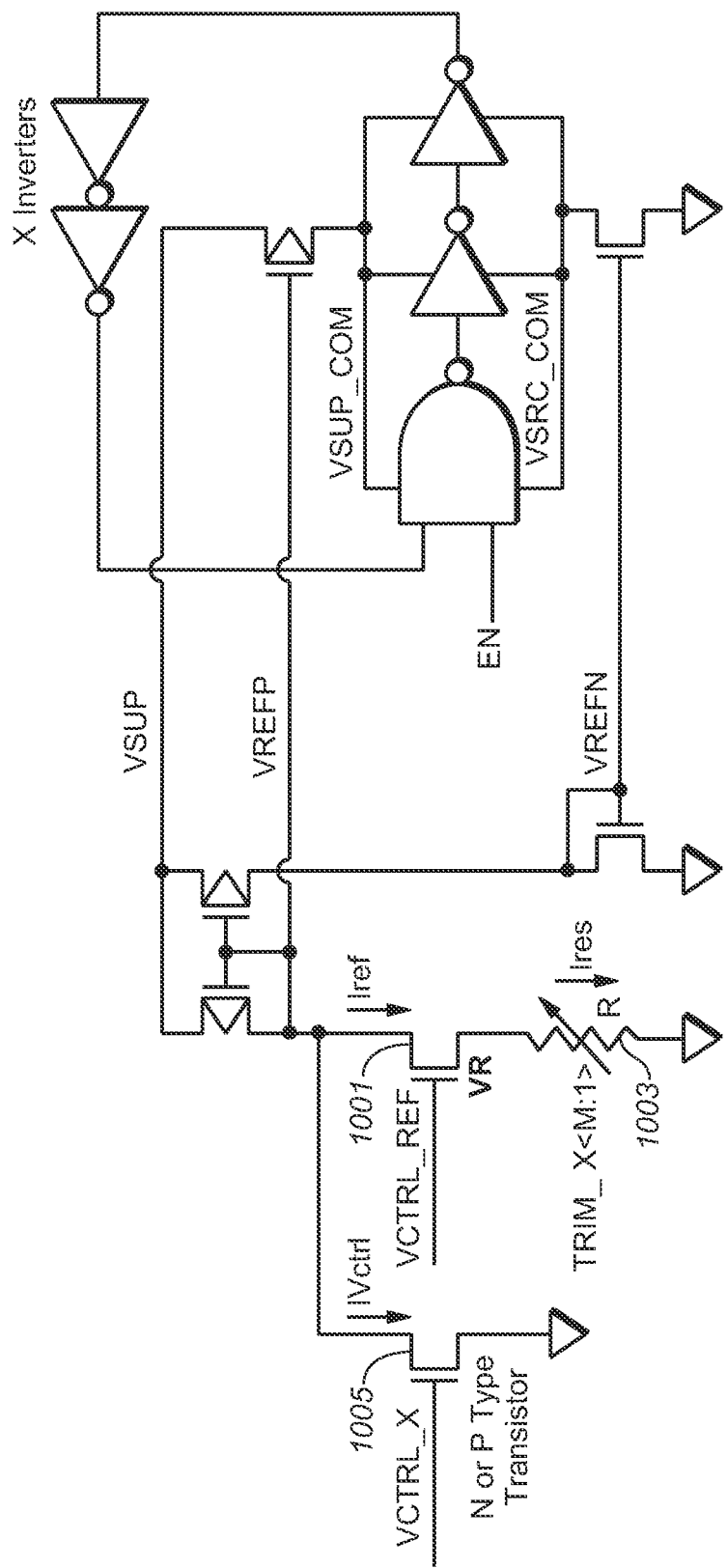
FIG. 14 illustrates a minimum reference VCO embodiment.

Whereas FIG. 11 presented a maximum reference VCO embodiment, FIG. 14 illustrates a minimum reference VCO embodiment. Aside from the far left leg, with transistor 1005, the basic VCO is the same as in FIG. 8A or (again without the left leg) FIG. 11. With a given VCTRL_REF to the gate of 1001, by adjusting the resistor R 1003 by TRIM_X<M:1>, Ires and Iref will change, affect the VSUP_COM/VSRC_COM and adjust the oscillator frequency as for FIG. 11. The left leg now drains off current from above transistor 1001; By adjusting VCTRL_X on the gate of (P or N type) transistor 1005, the current equation is now changed for min frequency to Iref=Ires+Ivctrl. This will affect the VSUP_COM/VSRC_COM ratio and adjust the oscillator frequency on the fly, so that the VCTRL_X can be used to regulate the CLK value upward from a minimum as set by VCTRL_REF and the trim value.

Figure 15:
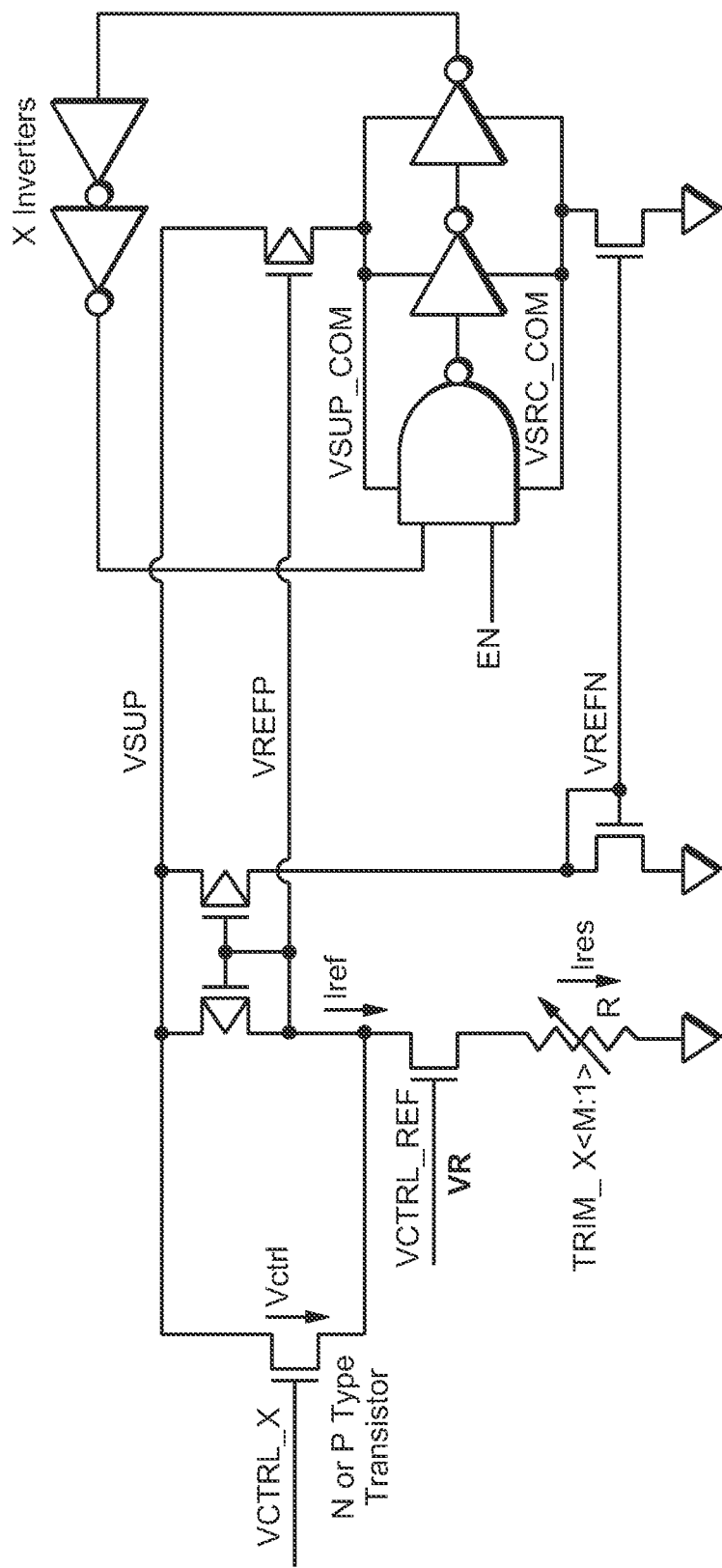
FIGS. 15-17 present some variations on the maximum reference VCO embodiment of FIG. 11.
Figure 16:
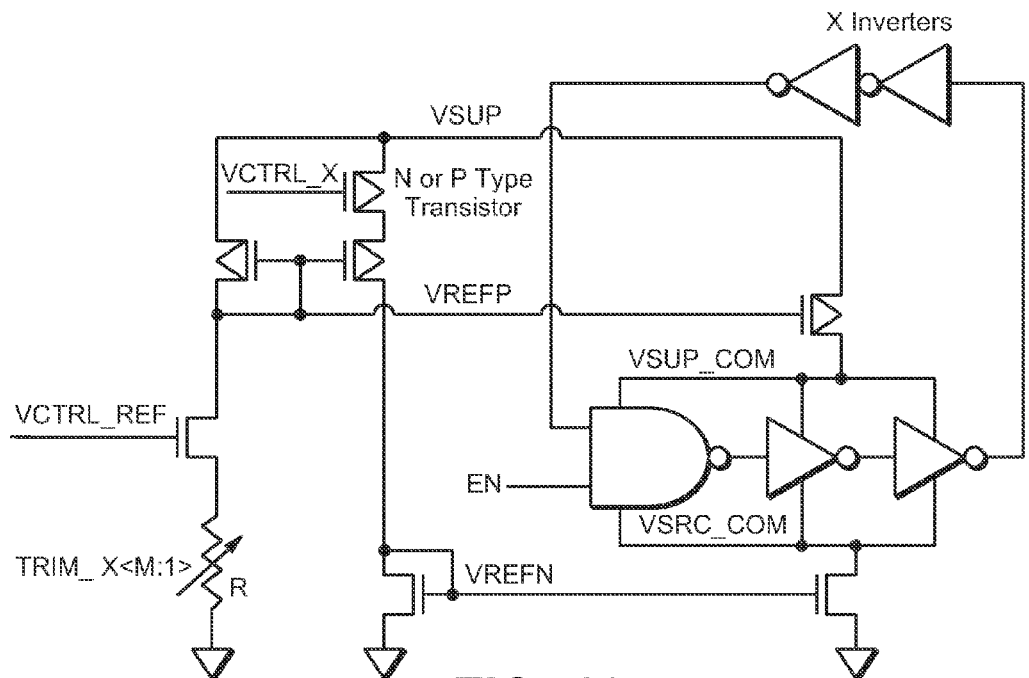
Figure 17:
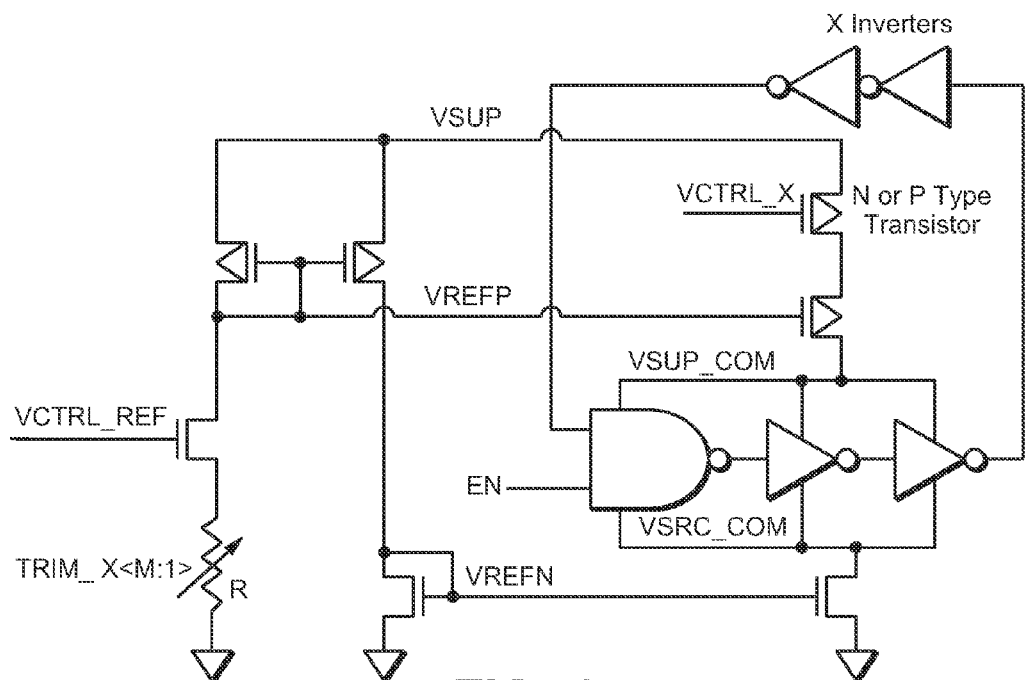

FIGS. 15-17 present some variations on the maximum reference VCO embodiment of FIG. 11. In each of these, the VCTRL_X controls the transistor to provide additional current at various legs of the oscillator to add current and increase the output frequency. Similar variations on FIG. 14, but instead using VCTRL_X to drain off current, can also be implemented for the minimum reference VCO embodiments.

Conclusion

The foregoing detailed description has been presented for purposes of illustration and description. It is not intended to be exhaustive or to limit the above to the precise form It is claimed:

1. A circuit for providing a plurality of clock signals of differing frequencies, comprising:
a phase locked loop section connected to receive a reference clock value and provide a first clock signal, including a first voltage controlled oscillator connected to receive a first voltage level and generate therefrom the first clock signal, the first voltage level being generated by the phase locked loop section based upon the reference clock value and feedback from the first clock signal; and
one or more second voltage controller oscillators, each connected to receive the first voltage level and a corresponding trim value and, concurrently with the generating of the first clock signal, generate therefrom a respective second clock signal having a frequency dependent upon the first voltage level and corresponding trim value,
wherein one or more of the second voltage controlled oscillators is further connected to receive a corresponding control voltage, the respective second clock signal having a frequency further dependent upon the corresponding control voltage's level, and
wherein the one or more second voltage controlled oscillators increase the frequency of the respective second clock signal in response to the corresponding control voltage's level increasing.

2. The circuit of claim 1, wherein the one or more second voltage controlled oscillators connected to receive the corresponding control voltage are connected to provide the respective second clock signals to one or more corresponding charge pump circuits for use in the regulation thereof, the corresponding control voltage's level being derived from the corresponding charge pump's output level.

3. The circuit of claim 1, wherein each of the one or more second voltage controlled oscillators includes a corresponding first transistor connected to increase a current flowing through the corresponding second voltage controlled oscillator in response to the corresponding control voltage's level.

4. The circuit of claim 1, wherein the phase locked loop section further includes:
a phase/frequency detector connected to receive the reference clock value and the feedback from the first clock signal and generate therefrom up/down control values; and
a charge pump connected to receive the up/down control values and generate therefrom the first voltage level.

5. The circuit of claim 4, wherein the phase locked loop further comprises:
a low pass filter through which the first voltage level is provided to the first voltage controller oscillator.

6. The circuit of claim 4, wherein the phase locked loop further comprises:
a frequency divider connected to receive the first clock signal and generate therefrom the feedback from the first clock signal.

7. The circuit of claim 1, wherein the circuit is formed on an integrated circuit further comprising:
a reference clock generation circuit to generate the reference clock value.

8. The circuit of claim 1, wherein the circuit is formed on a monolithic two-dimensional semiconductor memory device having memory cells arranged in a single physical level above a silicon substrate and comprise a charge storage medium.

9. The circuit of claim 1, wherein the circuit is formed on a monolithic three-dimensional semiconductor memory device having memory cells arranged in multiple physical levels above a silicon substrate and comprise a charge storage medium.

10. A circuit for providing a plurality of clock signals of differing frequencies, comprising:
a phase locked loop section connected to receive a reference clock value and provide a first clock signal, including a first voltage controlled oscillator connected to receive a first voltage level and generate therefrom the first clock signal, the first voltage level being generated by the phase locked loop section based upon the reference clock value and feedback from the first clock signal; and
one or more second voltage controller oscillators, each connected to receive the first voltage level and a corresponding trim value and, concurrently with the generating of the first clock signal, generate therefrom a respective second clock signal having a frequency dependent upon the first voltage level and corresponding trim value,
wherein one or more of the second voltage controlled oscillators is further connected to receive a corresponding control voltage, the respective second clock signal having a frequency further dependent upon the corresponding control voltage's level, and
wherein the one or more second voltage controlled oscillators decrease the frequency of the respective second clock signal in response to the corresponding control voltage's level increasing.

11. The circuit of claim 10, wherein each of the one or more second voltage controlled oscillators includes a corresponding first transistor connected to decrease a current flowing through the corresponding second voltage controlled oscillator in response to the corresponding control voltage's level.

12. The circuit of claim 10, wherein the one or more second voltage controlled oscillators connected to receive the corresponding control voltage are connected to provide the respective second clock signals to one or more corresponding charge pump circuits for use in the regulation thereof, the corresponding control voltage's level being derived from the corresponding charge pump's output level.

13. The circuit of claim 10, wherein the phase locked loop section further includes:
a phase/frequency detector connected to receive the reference clock value and the feedback from the first clock signal and generate therefrom up/down control values; and
a charge pump connected to receive the up/down control values and generate therefrom the first voltage level.

14. The circuit of claim 13, wherein the phase locked loop further comprises:
a low pass filter through which the first voltage level is provided to the first voltage controller oscillator.

15. The circuit of claim 13, wherein the phase locked loop further comprises:

a frequency divider connected to receive the first clock signal and generate therefrom the feedback from the first clock signal.

16. The circuit of claim 10, wherein the circuit is formed on an integrated circuit further comprising:
a reference clock generation circuit to generate the reference clock value.

17. The circuit of claim 10, wherein the circuit is formed on a monolithic two-dimensional semiconductor memory device having memory cells arranged in a single physical level above a silicon substrate and comprise a charge storage medium.

18. The circuit of claim 10, wherein the circuit is formed on a monolithic three-dimensional semiconductor memory device having memory cells arranged in multiple physical levels above a silicon substrate and comprise a charge storage medium.

* * * * *